United States Patent [19]

Bobba

[11] Patent Number: 5,063,383

[45] Date of Patent: Nov. 5, 1991

[54] SYSTEM AND METHOD FOR TESTING ANALOG TO DIGITAL CONVERTER EMBEDDED IN MICROCONTROLLER

[75] Inventor: Ram S. Bobba, San Jose, Calif.

[73] Assignee: National Semiconductor Corporation, Santa Clara, Calif.

[21] Appl. No.: 532,606

[22] Filed: Jun. 4, 1990

[51] Int. Cl.[5] .................. H03M 1/10; G06F 11/00
[52] U.S. Cl. ................... 341/120; 371/27; 324/73.1; 364/571.01; 364/553
[58] Field of Search ............ 341/120, 131, 139; 371/25.1, 27, 24, 26, 15.1, 16.1; 324/73.1; 364/553, 571.02, 571.07, 571.01, 550

[56] References Cited

U.S. PATENT DOCUMENTS

| | | | |
|---|---|---|---|
| 4,354,177 | 10/1982 | Sloane | 341/120 |
| 4,539,683 | 9/1985 | Hahn et al. | 341/120 |
| 4,700,174 | 10/1987 | Sutherland et al. | 341/120 |
| 4,816,750 | 3/1989 | Van Der Kloot et al. | 324/73.1 |
| 4,896,282 | 1/1990 | Orwell | 341/120 X |

*Primary Examiner*—A. D. Pellinen
*Assistant Examiner*—Sharon D. Logan
*Attorney, Agent, or Firm*—Flehr, Hohbach, Test, Albritton & Herbert

[57] ABSTRACT

A tester system tests the transfer characteristics and operability of an analog to digital converter (ADC) embedded in a microprocessor. The tester generates a sequence of analog signal test values, and prompts the microprocessor to read and convert each test value. The microprocessor sets up a table in its internal memory, the table having one tally value for every possible code output by the embedded ADC. After the embedded ADC converts each test value, the microprocessor reads the digital value output by the embedded ADC and increments a corresponding tally value in its internally stored table. When the sequence of tests is completed, the microprocessor transmits the entire table of tally values to the tester. The tester then performs a well known set of calculations on the tally data to determine the transfer characteristics and operability of the embedded ADC. By performing all tally operations in the microprocessor under test, the test sequence can be performed much more quickly than if each converted value were separately transmitted by the microprocessor to the tester. In addition, the tallying operation of the microprocessor simulates normal operation of the microprocessor while performing analog to digital conversions, and thus the embedded ADC is subjected to electromagnetic noise characteristic of the microprocessor under normal operation.

16 Claims, 2 Drawing Sheets

SYSTEM AND METHOD FOR TESTING ANALOG TO DIGITAL CONVERTER EMBEDDED IN MICROCONTROLLER

The present invention relates generally to testing complex semiconductor circuits, and particularly to methods and systems for testing the accuracy and linearity of an analog to digital converter which is embedded in a microcontroller or microprocessor.

BACKGROUND OF THE INVENTION

A number of microcontroller and microprocessor products now include an embedded analog to digital converter (ADC). This means that there is an ADC on the same semiconductor chip as the rest of the microcontroller's circuitry. For example, the COP888CF single chip CMOS controller made by National Semiconductor has an embedded ADC. In fact, that particular microcontroller has eight ADC channels (i.e., eight separate analog signal input connections). The development of such microcontrollers is a continuation of the trend toward putting all the circuitry needed for a programmable controller onto a single chip.

While complex semiconductor circuits with embedded circuits are convenient when building a product that needs a simple controller, such as a microwave oven controller, the presence of such embedded circuits makes it difficult to fully test the operation of the circuit.

Previous methods of testing embedded ADCs on digital VLSI test systems perform one conversion at a time. In other words, one analog signal is sent to the device under test, and the converted digital value is then read by the tester. The device under test is programmed to perform a conversion and then send the results of the conversion to the tester. Testing each possible output code of the ADC typically requires dozens of conversion and read sequences. Since the number of conversions typically used to test an eight bit ADC is in the range of 20,000 to 200,000, this testing method is very slow.

Another major disadvantage of the prior art methods of testing embedded ADCs is that the testing conditions do not match normal operating conditions. More specifically, when an embedded ADC is used in an actual application, the microcontroller will be performing many other operations, including computations, reading and writing data to and from registers and memory, and so on, all of which generate electromagnetic noise in the microcontroller. Standard prior art testing methods do not create the electromagnetic noise which is encountered during normal microcontroller operation.

SUMMARY OF THE INVENTION

In summary, the present invention is a tester system and method for testing the transfer characteristics and operability of an analog to digital converter (ADC) embedded in a microprocessor. The tester generates a sequence of analog signal test values, and prompts the microprocessor to read and convert each test value. The microprocessor sets up a table in its internal memory, the table having one tally value for every possible code output by the embedded ADC. After the embedded ADC converts each test value, the microprocessor reads the digital value output by the embedded ADC and increments a corresponding tally value in its internally stored table. When the sequence of tests is completed, the microprocessor transmits the entire table of tally values to the tester. The tester then performs a set of calculations on the tally data to determine the transfer characteristics and operability of the embedded ADC.

By performing all tally operations in the microprocessor under test, the test sequence can be performed much more quickly than if each converted value were separately transmitted by the microprocessor to the tester. In addition, the tallying operation of the microprocessor simulates normal operation of the microprocessor while performing analog to digital conversions, and thus the embedded ADC is subjected to electromagnetic noise characteristic of the microprocessor under normal operation.

Another important advantage of the present invention is that it enables an embedded ADC to be tested using a relatively inexpensive tester. In particular, the test equipment of the present invention does not need to perform measurements "on the fly"—all it needs is an accurate digital to analog converter for generating test voltages, plus a CPU with a few standard interface circuits for sending digital messages to and from the device under test.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

The terms "microcontroller" and "microprocessor" are used interchangeably herein, both terms being used to refer to single chip data processing circuits. A microcontroller or microprocessor which has an "embedded ADC" is one with an analog to digital converter circuit on the same chip as the microcontroller or microprocessor's other circuitry.

Each digital value output by an analog to digital converter (ADC) is herein called a "code" or "output code". An eight bit ADC can output 256 distinct output codes, while a ten bit ADC can output 1024 distinct output codes.

Figure 1:
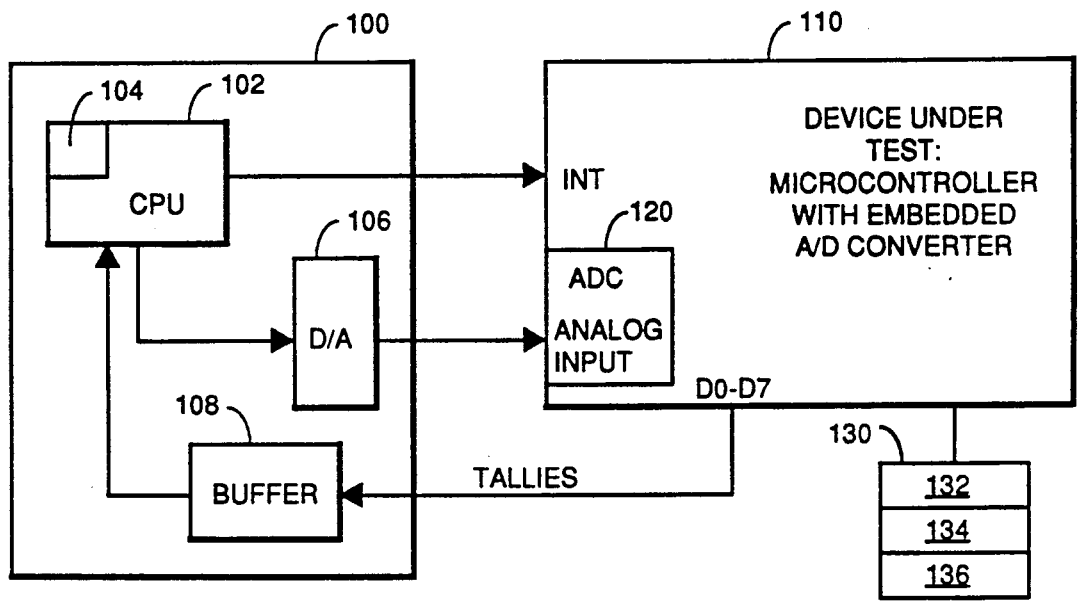
FIG. 1 is a block diagram of a test apparatus for testing an analog to digital converter embedded in a microprocessor.
Figure 2:
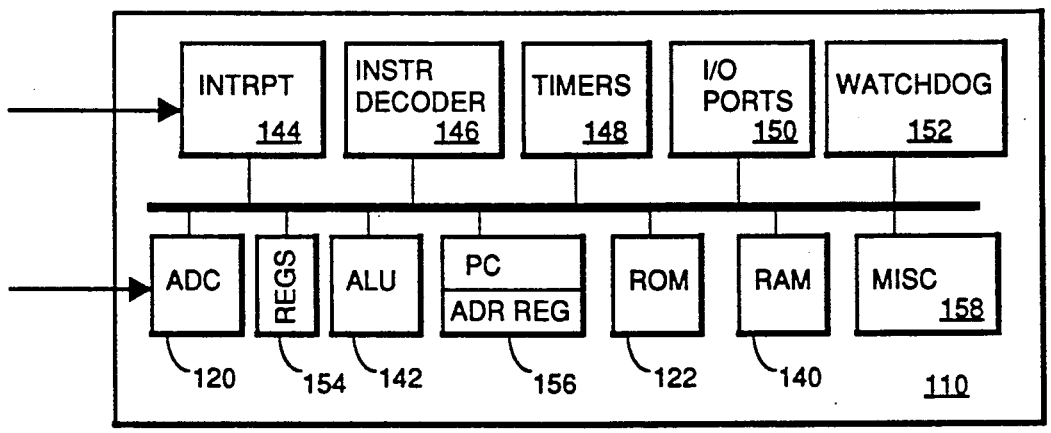
FIG. 2 is a block diagram of the circuits in a typical microcontroller having an embedded ADC.

Referring to FIGS. 1 and 2, the test apparatus 100 in the preferred embodiment includes a data processing unit 102, including test control software 104, a digital to analog converter (DAC) 106 with sixteen bit resolution, and a buffer 108 for transmitting data values received by the test apparatus to the data processing unit 102.

The device under test is a microprocessor 110 having an embedded analog to digital converter (ADC) 120, herein called the embedded ADC. The embedded ADC 120 typically has a resolution of eight or ten bits (i.e., 256 distinct output values or 1024 distinct output values). For the purposes of the explaining the invention, it is assumed that the embedded ADC 120 has a resolution of eight bits.

Most microcontrollers have the ability to execute instructions stored externally to the microcontroller 110, in addition to software stored in an internal ROM 122. The test system in the preferred embodiment includes a memory 130 external to the microcontroller which includes software 132-136 which is used while testing the embedded ADC 120. In particular, externally stored software 132 is used to initialize the microcontroller's internal random access memory (RAM) 140 by defining a table of values that will be described in more detail below with reference to FIGS. 4 and 5. Software 134 accumulates and stores data in the RAM 140 while the embedded ADC 120 is tested with a sequence of test values. Software 136 transmits the resulting table of values to the tester's data processing unit 102 at the conclusion of the test sequence.

The internal circuits of the microcontroller 110 generate noise which may or may not affect the operation of the ADC 120. FIG. 2 shows some of the common circuits found in most such microcontrollers, including an internal random access memory 140, arithmetic logic unit (ALU) 142, interrupt processing circuit 144, instruction decoder 146, timers 148, input/output port circuits 150, a watchdog circuit 152, register logic 154, program counter and address register circuits 156, and other miscellaneous circuitry 158. The present invention exercises at least some of these internal circuits while testing the operation of the ADC 120, thereby subjecting the ADC 120 to electromagnetic noise characteristic of the microcontroller 110 under normal operation.

Figure 3:
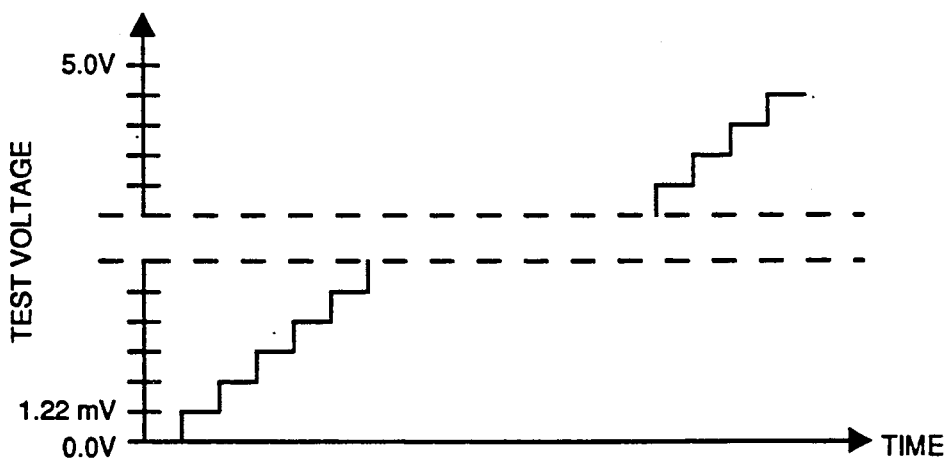
FIG. 3 depicts a sequence of analog test signals used in a preferred embodiment.

In the preferred embodiment, the tester's DAC 106 has a resolution of sixteen bits while the embedded ADC 120 being tested has a resolution of only eight bits. Referring to FIG. 3, this enables the tester 100 to generate test voltages which take the form of a staircase of increasing voltage values within the nominal voltage range corresponding to each output code of the embedded ADC 120. For example, if the voltage range for a particular output code (e.g., output code 1) is 19.53 millivolts to 39.06 millivolts, the tester 100 will generate a staircase of N distinct test voltages within that range while testing the embedded ADC 120, where N is a positive integer such as eight or sixteen.

In the preferred embodiment, the tester 100 outputs sixteen voltage steps within the range assigned to each distinct output code of the embedded ADC 120. For an eight bit ADC 120 operating in a circuit with a maximum voltage swing of five volts, each distinct output code corresponds to a voltage range of about 19.53 millivolts (i.e., 5 volts divided by 256). To provide a staircase of test voltages with sixteen steps per output code, the tester generates test voltages which increase by about 1.22 millivolts per step, as shown in FIG. 3.

Figure 4:
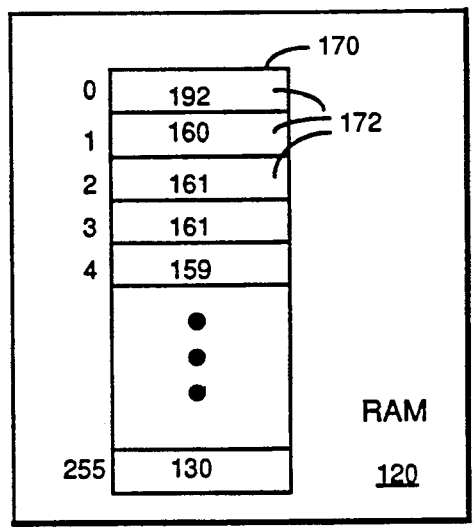
FIG. 4 is a block diagram of a table of tally values stored in the random access memory of a microcontroller being tested.

Referring to FIG. 4, a table 170 of "tally values" is stored in a table inside the microcontroller's RAM 120. Tallying works as follows. For an eight bit ADC there are 256 distinct output codes. Therefore, for this ADC 120 the test software will define a tally table 170 having 256 entries 172 for storing tally values, with values of zero initially stored in every entry. Then, every time the ADC 120 performs a conversion, an entry corresponding to the output code generated by the ADC is incremented. In other words, if the output code from the ADC is equal to thirty-one (i.e., 1F hex), then entry thirty-one in the table 170 is incremented.

To generate a meaningful set of tally values, the tester 100 prompts the embedded ADC 120 to perform a large number of conversions while the input test voltage is within the voltage range corresponding to each distinct output code. For instance, in the preferred embodiment, the tester software 104 is set up to initiate 160 ADC conversions for each ADC output code. Thus, at the end of the test all the entries in the tally table 170 (except for possibly the first and last entries) for a perfect ADC 120 would be equal to 160.

Figure 5:
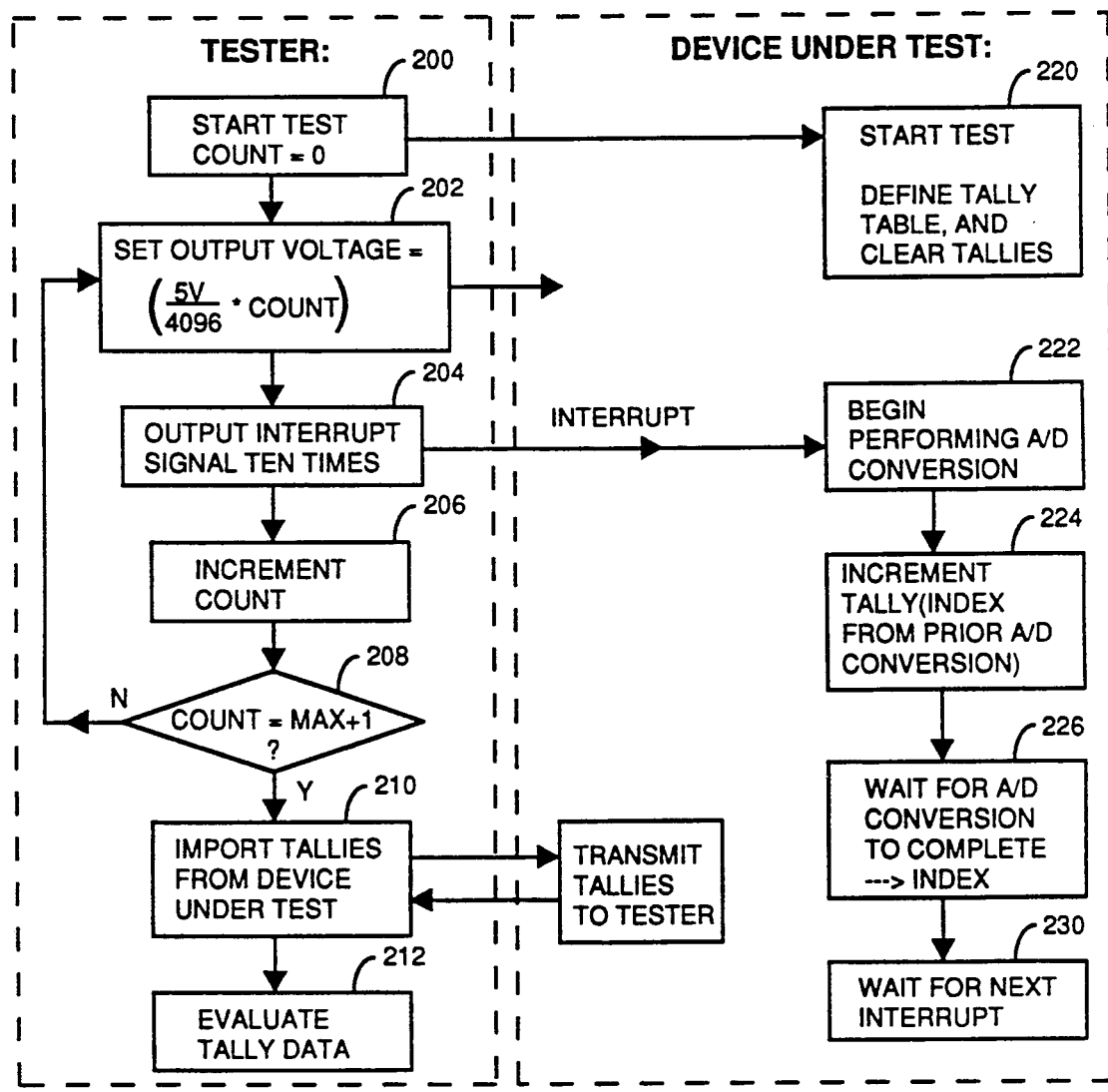
FIG. 5 is a flow chart of a testing method in accordance with the present invention.

FIG. 5 is a flow chart of the test software 104 in the tester 100 and the microcontroller's software 132-136 which is used while testing the embedded ADC 120. The tester initiates the beginning of the test by sending a first signal to the microcontroller and setting an internal counter (COUNT) to zero (step 200). The microcontroller 110 responds by defining and clearing a tally table 170 in its internal RAM 120 a tally table 170 (step 220).

Next (step 202), the tester sets the output voltage to be generated in accordance with the following formula:

$$\text{TEST VOLTAGE} = \left( \frac{5 \text{ Volts}}{4096} \cdot \text{COUNT} \right)$$

where 5 volts is the fully voltage range in which the ADC 120 is being tested, 4096 is the number of voltage steps being used, COUNT denotes the current voltage step being generated.

Once the test voltage has been set up, ten interrupt signals are sent to the microcontroller 110 (step 204) so as to prompt the embedded ADC 120 to convert the test voltage ten times The microcontroller and its embedded ADC 120 respond to each interrupt signal by performing an ADC conversion, thereby generating an output code, which serves as an index into the tally table 170. The indexed entry in the table (i.e., the tally for the output code generated by the embedded ADC 120) is then incremented.

More specifically, in response to each interrupt signal, the embedded ADC 120 begins to perform an analog to digital conversion of the test voltage. However, it takes about a dozen of the microcontroller's CPU cycles for the conversion to be completed. During this time, the output code from the previous analog to digital conversion is used as an index into the tally table 170, and this indexed entry in the table is then incremented (step 224). Then the microcontroller waits for the current analog to digital conversion to complete (step 226), thereby generating the output code (or index) to be used for tallying during the next test cycle. Finally, the microcontroller waits for the next interrupt signal from the tester (step 230). Thus the process of performing an analog to digital conversion using the embedded ADC is overlapped with the tallying operation using the results of the prior analog to digital conversion.

After the tester has output ten interrupt signals (box 204) for the current test voltage, it increments its internal counter COUNT (box 206) and tests to see if the counter is equal to a predefined maximum value which corresponds to the last test voltage (box 208), which in this example would be a value of 4096. If the value of COUNT has not yet reached this value, the cycle (steps 202 through 206) repeats for the next test voltage.

When all the tests have been completed, the entries of the tally table 170 will indicate the number of times that each output code was generated. At this point in the test procedure the tester imports the transmitted table (box 210) and then runs a standard routine for evaluating the tally data (box 212) to determine whether the embedded ADC is sufficiently linear to be commercially acceptable. For a reasonably linear and operational embedded ADC 120, the tallies will all be reasonably close to the target value of 160.

ALTERNATE EMBODIMENTS

It should be noted that in other embodiments of the invention, the embedded ADC could be a device for measuring currents rather than voltages. Furthermore, some prior art tallying methods for testing analog to digital converters use various methods for weighting the contributions of each test conversion to the tally for each code. To incorporate such weighted tally techniques into the present, one would need only to change step 224 for incrementing a selected tally to the modified step of "adding a weighted value to a selected tally" with the weighted value being computed in accordance with a specified formula or algorithm.

Another variation of the above described testing method is required for microcontrollers having a RAM 140 which is too small to hold the entire table 170 required for tallying. For example, if the RAM can only hold 128 values (i.e., the RAM 140 has 128 bytes) but there are 256 distinct output codes, the following test sequence could be used. First, the tester would generate tests (i.e., test voltages and interrupt signals) for the first 125 test voltages. Then the first 120 entries of the tally table would be transmitted to the tester and the remaining entries would be shifter to the beginning of the table 170. Then the tests for the next 120 test voltages (for output codes 125 through 244) would be generated, followed by transmission of the tallies for output codes 120 through 239 to the tester and shifting the remaining entries (starting at the entry for code 240) of the table to its beginning. Finally, tests for the last sixteen test voltages would be run and the remainder of the tally table sent to the tester.

As will be appreciated by those skilled in the art, there are a number of other techniques which could be used to handle small internal RAMs 140. For instance, one could run the tests for output codes 0 through 130 (but performing no tallying for output codes in excess of 127) and export the first half of the table. Then one could clear the table and run the tests for output codes 125 through 256 (while ignoring output codes below 128) and then export the second half of the table to the tester. This second technique requires less transmissions from the microcontroller to the tester, but requires running tests on a few output codes twice.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of testing an analog to digital converter (ADC) embedded in a microprocessor, said embedded ADC generating a predefined number of distinct, digital output values when converting input analog signals, said microprocessor having a random access memory embedded in said microprocessor for storing data values and program means coupled to said microprocessor for storing software which controls the operation of said microprocessor, the steps of the method comprising:

storing in said microprocessor's program mean a data tallying control program;

generating a sequence of analog test signals within a predefined range and transmitting said analog test signals to said embedded ADC;

said embedded ADC converting each said analog test signal and generating a digital output value;

said microprocessor, under control of said data tallying control program, tallying said digital output values generated by said embedded ADC and storing corresponding tally values in said microprocessor's embedded random access memory; and after said sequence of analog test signals has been transmitted and converted, transmitting said tally values stored in said embedded random access memory in said microprocessor to a tester, and then evaluating said tally values in said tester.

2. The method of testing an analog to digital converter (ADC) embedded in a microprocessor set forth in claim 1, wherein said generating step generates analog voltage test signals within a predefined range and said embedded ADC converts analog voltage signals into digital values.

3. The method of testing an analog to digital converter (ADC) embedded in a microprocessor set forth in claim 1, wherein said generating step generates analog current test signals within a predefined range and said embedded ADC converts analog current signals into digital values.

4. The method of testing an analog to digital converter (ADC) embedded in a microprocessor set forth in claim 1, wherein said embedded random access memory can store tally values corresponding to a predefined maximum number X of distinct digital output values generated by said embedded ADC;

said embedded ADC is capable of generating more distinct digital output values than X;

said method including the step of repeating said generating, converting, storing and accumulating, and transmitting steps for plurality of different signal ranges; said plurality of different signal ranges together corresponding to all distinct digital output values which can be generated by said embedded ADC.

5. The method of testing an analog to digital converter (ADC) embedded in a microprocessor, said embedded ADC generating a predefined number of distinct, digital output values when converting input analog signals, said microprocessor having a random access memory embedded in said microprocessor for storing data values and program means coupled to said microprocessor for storing software which controls the operation of said microprocessor, the steps of the method comprising:

storing in said microprocessor's program mean a data tallying control program;

said microprocessor, under the control of said data tallying control program, defining in said embedded random access memory in said microprocessor a table having tally entries for storing a multiplicity of tally values, each said tally entry in said table corresponding to a distinct, digital output value generated by said embedded ADC;

generating a sequence of analog test signals within a predefined range and transmitting said analog test signals to said embedded ADC;

said embedded ADC converting each said analog test signal and generating a digital output value;

said microprocessor, under control of said data tallying control program, incrementing said tally value stored in said table entry corresponding to said digital output value generated by said embedded ADC; and after said sequence of analog test signals has been transmitted and converted, transmitting said table of tally values stored in said embedded random access memory of said microprocessor to a tester, and then evaluating said tally values in said tester;

whereby tally values are accumulated in random access memory embedded in said microprocessor, which enables fast testing of the embedded ADC.

6. The method of testing an analog to digital converter (ADC) embedded in a microprocessor set forth in claim 5, wherein said generating step generates analog voltage test signals within a predefined range and said embedded ADC converts analog voltage signals into digital values.

7. The method of testing an analog to digital converter (ADC) embedded in a microprocessor set forth in claim 5, wherein said generating step generates analog current test signals within a predefined range and said embedded ADC converts analog current signals into digital values.

8. The method of testing an analog to digital converter (ADC) embedded in a microprocessor set forth in claim 5, wherein said random access memory can store entries corresponding to a predefined maximum number X of distinct digital output values generated by said embedded ADC;

said embedded ADC is capable of generating more distinct digital output values than X;

said method including the step of repeating said generating, converting, incrementing, and transmitting steps for plurality of different signal ranges; said plurality of different signal ranges together corresponding to all distinct digital output values which can be generated by said embedded ADC.

9. Test apparatus for testing an analog to digital converter (ADC) embedded in a microprocessor, said embedded ADC generating a predefined number of distinct, digital output values when converting input analog signals, said microprocessor having a random access memory for storing data values, the test apparatus comprising:

a data processing unit coupled to an analog signal generator, said data processing unit and analog signal generator generating a sequence of analog test signals within a predefined range and transmitting said analog test signals to an embedded ADC in a microprocessor; said data processing unit and analog signal generator including means for generating a prompting signal which causes said embedded ADC to convert each said analog test signal into a digital output value; and program means coupled to said microprocessor for directing said microprocessor to store and accumulate in said random access memory in said microprocessor data corresponding to said digital output values output by said embedded ADC;

said program means including software for directing said microprocessor to transmit said data stored in said random access memory in said microprocessor to said data processing unit after said sequence of analog test signals has been converted by said embedded ADC;

said data processing unit including software for evaluating said data accumulated and stored in said microprocessor and transmitted by said microprocessor to said data processing unit;

whereby data resulting from testing of said embedded ADC is accumulated in random access memory in said microprocessor, which enables fast testing of the embedded ADC.

10. The test apparatus set forth in claim 9, wherein said analog signal generator generates analog voltage test signals within a predefined range and said embedded ADC converts analog voltage signals into digital values.

11. The test apparatus set forth in claim 9, wherein said analog signal generator generates analog current test signals within a predefined range and said embedded ADC converts analog current signals into digital values.

12. The test apparatus set forth in claim 9, wherein said random access memory can store data corresponding to a predefined maximum number X of distinct digital output values generated by said embedded ADC;

said embedded ADC is capable of generating more distinct digital output values than X;

said data processing unit and analog signal generator generating a plurality of analog test signals sequences within a plurality of predefined signal ranges;

program means including means for directing said microprocessor to store and accumulate in said random access memory in said microprocessor data corresponding to digital output values output by said embedded ADC in response to each said sequence of analog test signals and to transmit at least a portion of said data corresponding to each said sequence of analog test signals to said data processing unit after each said sequence of analog test signals has been converted by said embedded ADC;

said plurality of different signal ranges together corresponding to all distinct digital output values which can be generated by said embedded ADC.

13. Test apparatus for testing an analog to digital converter (ADC) embedded in a microprocessor, said embedded ADC generating a predefined number of distinct, digital output values when converting input analog signals, said microprocessor having a random access memory for storing data values, the test apparatus comprising:

a data processing unit coupled to an analog signal generator, said data processing unit and analog signal generator generating a sequence of analog test signals within a predefined range and transmitting said analog test signals to an embedded ADC in a microprocessor; said data processing unit and analog signal generator including means for generating a prompting signal which causes said embedded ADC to convert each said analog test signal into a digital output value; and program means coupled to said microprocessor for defining in said random access memory in said microprocessor a table having entries for storing a multiplicity of tally values, each said entry in said table corresponding to a distinct, digital output value generated by said embedded ADC;

said program means directing said microprocessor to increment said tally value stored in said table entry corresponding to each said digital output value generated by said embedded ADC;

said program means further including software for directing said microprocessor to transmit said tally values stored in said random access memory in said microprocessor to said data processing unit after said sequence of analog test signals has been converted by said embedded ADC;

said data processing unit including software for evaluating said data accumulated and stored in said microprocessor and transmitted by said microprocessor to said data processing unit;

whereby said tally values are accumulated in random access memory in said microprocessor, which enables fast testing of the embedded ADC.

14. The test apparatus set forth in claim 13, wherein said analog signal generator generates analog voltage test signals within a predefined range and said embedded ADC converts analog voltage signals into digital values.

15. The test apparatus set forth in claim 13, wherein said analog signal generator generates analog current test signals within a predefined range and said embedded ADC converts analog current signals into digital values.

16. The test apparatus set forth in claim 13, wherein said random access memory can store entries corresponding to a predefined maximum number X of distinct digital output values generated by said embedded ADC;

said embedded ADC is capable of generating more distinct digital output values than X;

said data processing unit and analog signal generator generating a plurality of analog test signals sequences within a plurality of predefined signal ranges;

said program means including means for directing said microprocessor to increment in said random access memory tally values stored in said table entries in response to each said sequence of analog test signals and to transmit at least a portion of said table entries corresponding to each said sequence of analog test signals to said data processing unit after each said sequence of analog test signals has been converted by said embedded ADC;

said plurality of different signal ranges together corresponding to all distinct digital output values which can be generated by said embedded ADC.

* * * * *